(12) United States Patent
Agarwal et al.

(10) Patent No.: US 10,529,693 B2
(45) Date of Patent: Jan. 7, 2020

(54) 3D STACKED DIES WITH DISPARATE INTERCONNECT FOOTPRINTS

(71) Applicants: Rahul Agarwal, Livermore, CA (US); Milind S. Bhagavat, Mountain View, CA (US)

(72) Inventors: Rahul Agarwal, Livermore, CA (US); Milind S. Bhagavat, Mountain View, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/826,054

(22) Filed: Nov. 29, 2017

(65) Prior Publication Data
US 2019/0164936 A1 May 30, 2019

(51) Int. Cl.
*H01L 25/065* (2006.01)
*H01L 23/00* (2006.01)
(Continued)

(52) U.S. Cl.
CPC ........ *H01L 25/0657* (2013.01); *H01L 21/486* (2013.01); *H01L 23/481* (2013.01); *H01L 23/49827* (2013.01); *H01L 23/5226* (2013.01); *H01L 23/5384* (2013.01); *H01L 23/5389* (2013.01); *H01L 24/82* (2013.01); *H01L 2224/1308* (2013.01); *H01L 2224/13025* (2013.01); *H01L 2224/16* (2013.01); *H01L 2224/16145* (2013.01);
(Continued)

(58) Field of Classification Search
CPC . H01L 2224/48227; H01L 2224/32145; H01L 25/0657; H01L 23/481; H01L 21/76898; H01L 2225/06541; H01L 2924/1532
See application file for complete search history.

(56) References Cited

U.S. PATENT DOCUMENTS

| 5,901,041 A | 5/1999 | Davies et al. |
| 6,589,802 B1 | 7/2003 | Asada et al. |

(Continued)

FOREIGN PATENT DOCUMENTS

| JP | 05160296 | 6/1993 |
| JP | 11265909 | 9/1999 |

(Continued)

OTHER PUBLICATIONS

PCT/US2011/051075 International Search Report dated Dec. 27, 2011.

*Primary Examiner* — Ngan V Ngo
(74) *Attorney, Agent, or Firm* — Timothy M. Honeycutt

(57) ABSTRACT

Various semiconductor chip devices with stacked chips are disclosed. In one aspect, a semiconductor chip device is provided. The semiconductor chip device includes a first semiconductor chip that has a front side and a back side and plural through chip vias. The through chip vias have a first footprint. The back side is configured to have a second semiconductor chip stacked thereon. The second semiconductor chip includes plural interconnects that have a second footprint larger than the first footprint. The back side includes a backside interconnect structure configured to connect to the interconnects and provide fanned-in pathways to the through chip vias.

20 Claims, 12 Drawing Sheets

(51) Int. Cl.
*H01L 23/538* (2006.01)
*H01L 23/522* (2006.01)
*H01L 23/498* (2006.01)
*H01L 21/48* (2006.01)
*H01L 23/48* (2006.01)

(52) U.S. Cl.
CPC ............ *H01L 2224/16146* (2013.01); *H01L 2224/16235* (2013.01); *H01L 2224/32145* (2013.01); *H01L 2224/48145* (2013.01); *H01L 2225/0652* (2013.01); *H01L 2225/06513* (2013.01); *H01L 2225/06541* (2013.01); *H01L 2225/06551* (2013.01); *H01L 2225/06555* (2013.01); *H01L 2225/06572* (2013.01); *H01L 2924/1532* (2013.01)

(56) References Cited

U.S. PATENT DOCUMENTS

| | | | |
|---|---|---|---|
| 6,977,686 B2 | 12/2005 | Shinomiya et al. | |
| 7,198,980 B2 | 4/2007 | Jiang et al. | |
| 7,915,720 B2 | 3/2011 | Tashiro et al. | |
| 8,372,741 B1* | 2/2013 | Co | H01L 24/03 |
| | | | 438/617 |
| 8,691,626 B2 | 4/2014 | Su et al. | |
| 8,842,945 B2* | 9/2014 | Nguyen | G02B 6/12004 |
| | | | 385/1 |
| 9,214,454 B2* | 12/2015 | Haba | H01L 25/105 |
| 9,312,198 B2* | 4/2016 | Meyer | H01L 23/31 |
| 9,502,390 B2* | 11/2016 | Caskey | H05K 1/0298 |
| 9,520,333 B1* | 12/2016 | Shih | H01L 23/3171 |
| 9,601,461 B2* | 3/2017 | Ho | H01L 25/0652 |
| 9,620,464 B2* | 4/2017 | Baks | H01L 23/49827 |
| 9,768,105 B2* | 9/2017 | Lii | H01L 23/49838 |
| 9,780,079 B2* | 10/2017 | Li | H01L 25/18 |
| 9,806,014 B2* | 10/2017 | Alfano | H01L 23/49838 |
| 9,812,429 B2* | 11/2017 | Das | H01L 25/0657 |
| 9,818,697 B2* | 11/2017 | Lin | H01L 23/5389 |
| 9,859,191 B2* | 1/2018 | Lee | H01L 23/481 |
| 9,893,036 B2* | 2/2018 | Ogiso | H01L 25/0657 |
| 9,966,325 B2* | 5/2018 | Beyne | H01L 23/481 |
| 9,972,611 B2* | 5/2018 | Pappu | H01L 25/18 |
| 2001/0050441 A1 | 12/2001 | Shivkumar et al. | |
| 2003/0209837 A1 | 11/2003 | Farnworth | |
| 2004/0124513 A1 | 7/2004 | Ho et al. | |
| 2005/0167798 A1 | 8/2005 | Doan | |
| 2006/0207789 A1 | 9/2006 | Soeta | |
| 2007/0205501 A1 | 9/2007 | Lee et al. | |
| 2008/0081401 A1 | 4/2008 | Shizuno | |
| 2011/0089573 A1* | 4/2011 | Kurita | H01L 23/3121 |
| | | | 257/774 |
| 2016/0351540 A1* | 12/2016 | Ogiso | H01L 23/481 |
| 2018/0040592 A1* | 2/2018 | Gandhi | H01L 23/4012 |
| 2018/0130772 A1* | 5/2018 | Yu | H01L 25/50 |

FOREIGN PATENT DOCUMENTS

| | | |
|---|---|---|
| JP | 2000311905 | 11/2000 |
| JP | 2000357768 | 12/2000 |
| JP | 2009158623 | 7/2009 |

* cited by examiner

3D STACKED DIES WITH DISPARATE INTERCONNECT FOOTPRINTS

BACKGROUND OF THE INVENTION

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

Stacked dice arrangements involve placing or stacking one or more semiconductor chips on a base semiconductor chip. In some conventional variants, the base semiconductor chip is a high heat dissipating device, such as a microprocessor. The stacked chips are sometimes memory devices. In a typical conventional microprocessor design, the chip itself has a floor plan with various types of logic blocks, such as floating point, integer, I/O management, and cache blocks frequently interspersed among each other. The power densities of the blocks vary: some have relatively higher power densities and some have relatively lower power densities.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
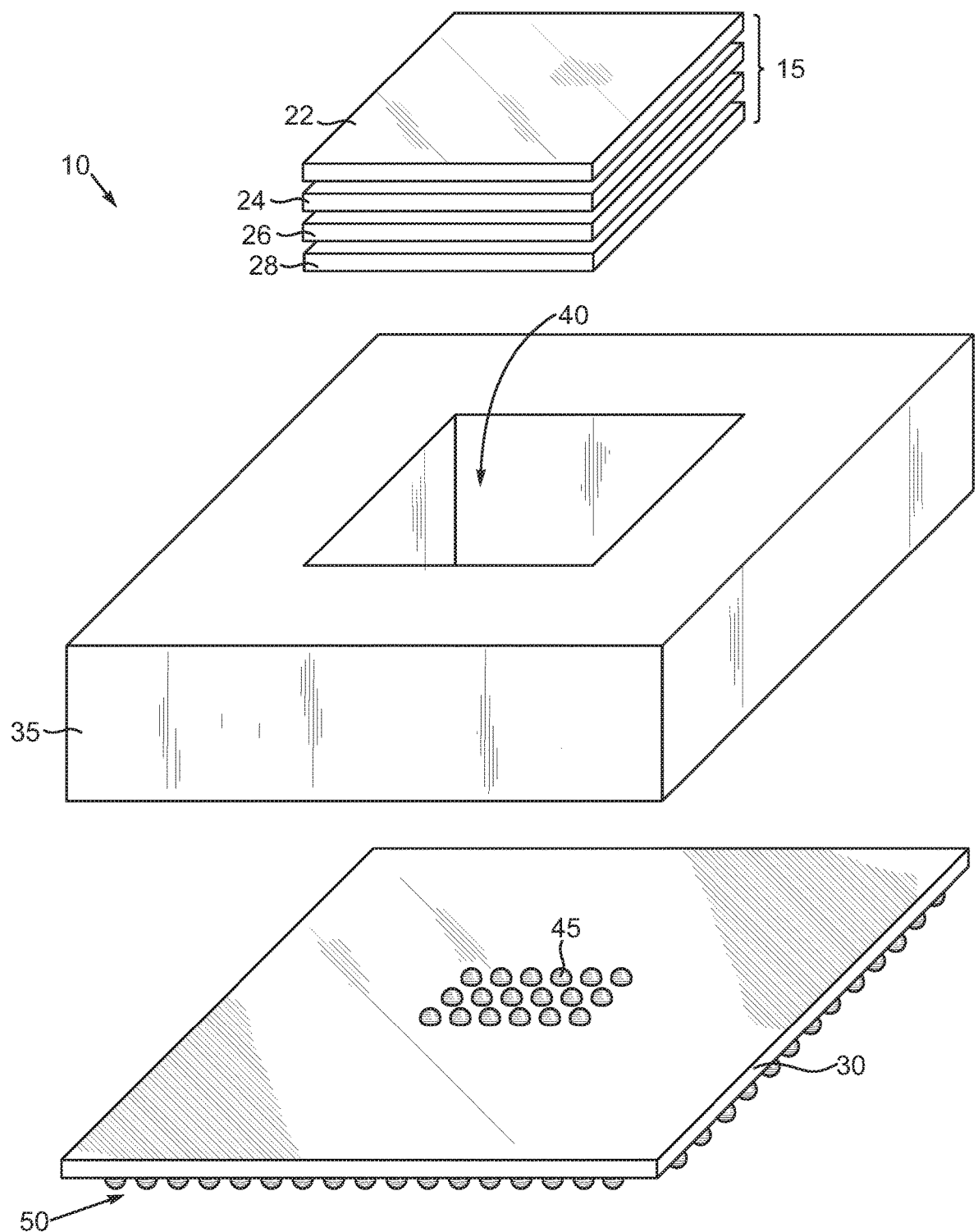
FIG. 1 is an exploded pictorial view of an exemplary semiconductor chip device that includes a semiconductor chip and a stack of semiconductor chips positioned thereon.

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Another critical design issue associated with stacked semiconductor chips is thermal management. Most electrical devices dissipate heat as a result of resistive losses, and semiconductor chips and the circuit boards that carry them are no exception. Still another technical challenge associated with stacked semiconductor chips is testing.

A process flow to transform a bare semiconductor wafer into a collection of chips and then mount those chips on packages or other boards involves a large number of individual steps. Because the processing and mounting of a semiconductor chip proceeds in a generally linear fashion, that is, various steps are usually performed in a specific order, it is desirable to be able to identify defective parts as early in a flow as possible. In this way, defective parts may be identified so that they do not undergo needless additional processing. This economic incentive to identify defective parts as early in the processing phase as possible is certainly present in the design and manufacture of stacked semiconductor chip devices.

Thermal management of semiconductor chips in a stacked arrangement remains a technical challenge during required electrical testing and operation of one or more of the semiconductor chips. A given semiconductor chip in a stacked arrangement, whether the first, an intermediary or the last in the particular stack, may dissipate heat to such an extent that active thermal management is necessary in order to either prevent the one or all of the semiconductor chips in the stack from entering thermal runaway or so that one or more of the semiconductor chips in the stack may be electrically tested at near or true operational power levels and frequencies.

Many chips otherwise suitable for stacking typically have microbump maps with microbumps distributed over some wide area at some minimum pitch. This microbump mapping must be imposed on the layout of the through-chip vias in the lowermost or base chip. The through-chip vias in the lowermost chip are typically spaced with a much smaller pitch. However, imposing the microbump mapping into the base chip can consume valuable chip space and constrain layouts.

In accordance with one aspect of the present invention, a semiconductor chip device includes a first semiconductor chip that has a front side and a back side and plural through chip vias. The through chip vias have a first footprint. The back side is configured to have a second semiconductor chip stacked thereon. The second semiconductor chip includes plural interconnects that have a second footprint larger than the first footprint. The back side includes a backside interconnect structure configured to connect to the interconnects and provide fanned-in pathways to the through chip vias.

In accordance with another aspect of the present invention, a semiconductor chip device includes a first semiconductor chip that has a front side and a back side and plural through chip vias. The through chip vias have a first footprint. Plural second semiconductor chips are stacked on the back side of the first semiconductor chip. A lowermost of the second semiconductor chips includes plural interconnects that have a second footprint larger than the first footprint. The back side includes a backside interconnect structure configured to connect to the interconnects and provide fanned-in pathways to the through chip vias.

In accordance with another aspect of the present invention, a method of manufacturing a semiconductor chip device includes fabricating a backside interconnect structure on a back side of a first semiconductor chip. The first semiconductor chip has plural through-chip vias with a first footprint. The back side is configured to have a second semiconductor chip stacked thereon. The second semiconductor chip includes plural interconnects that have a second footprint larger than the first footprint. The backside interconnect structure is configured to connect to the interconnects and provide fanned-in pathways to the through chip vias.

In the drawings described below, reference numerals are generally repeated where identical elements appear in more than one figure. Turning now to the drawings, and in particular to FIG. 1, therein is depicted an exploded pictorial view of an exemplary semiconductor chip device 10 that includes a stack 15 of semiconductor chips 22, 24, 26 and 28 stacked on another semiconductor chip 30. The stack 15 can number one or more chips 22, 24 etc. The semiconductor chip stack 15 can be at least partially encased by a molding material 35. An opening 40 in the molding material 35 is depicted simply to show where within the molding material 35 the chip stack 15 is positioned after the molding material 35 is molded. The semiconductor chips 22, 24, 26, 28 and 30 can be any of a variety of integrated circuits. A non-exhaustive list of examples includes microprocessors, graphics processing units, accelerated processing units that combines aspects of both, memory devices, an application integrated specific circuit or other. It is desirable for the materials selected for the molding material 35 to exhibit suitable viscosity at the applicable molding temperatures and have molding temperatures lower than the melting points of any of the solder structures present at the time of the molding processes. In an exemplary arrangement the materials for the molding material 35 can have a molding temperature of about 165° C. Two commercial variants are Sumitomo EME-G750 and G760. Well-known compression molding techniques can be used to mold the molding material 35.

The chip stack 15 is interconnected to the semiconductor chip 30 by way of plural interconnects 45. The interconnects 45 can be solder bumps, solder micro-bumps, conductive pillars or other interconnects. Well-known lead free solders, such as Sn—Ag, Sn—Ag—Cu or others can be used. Conductive pillars of copper, gold, aluminum, combinations of the these or the like can be used with or without solder caps. To interface electrically with another component such as a circuit board or other device, the semiconductor chip 30 can include plural I/O structures 50. The I/O structures 50 can be conductive pillars, solder balls, solder bumps or other types of interconnect structures.

Figure 2:
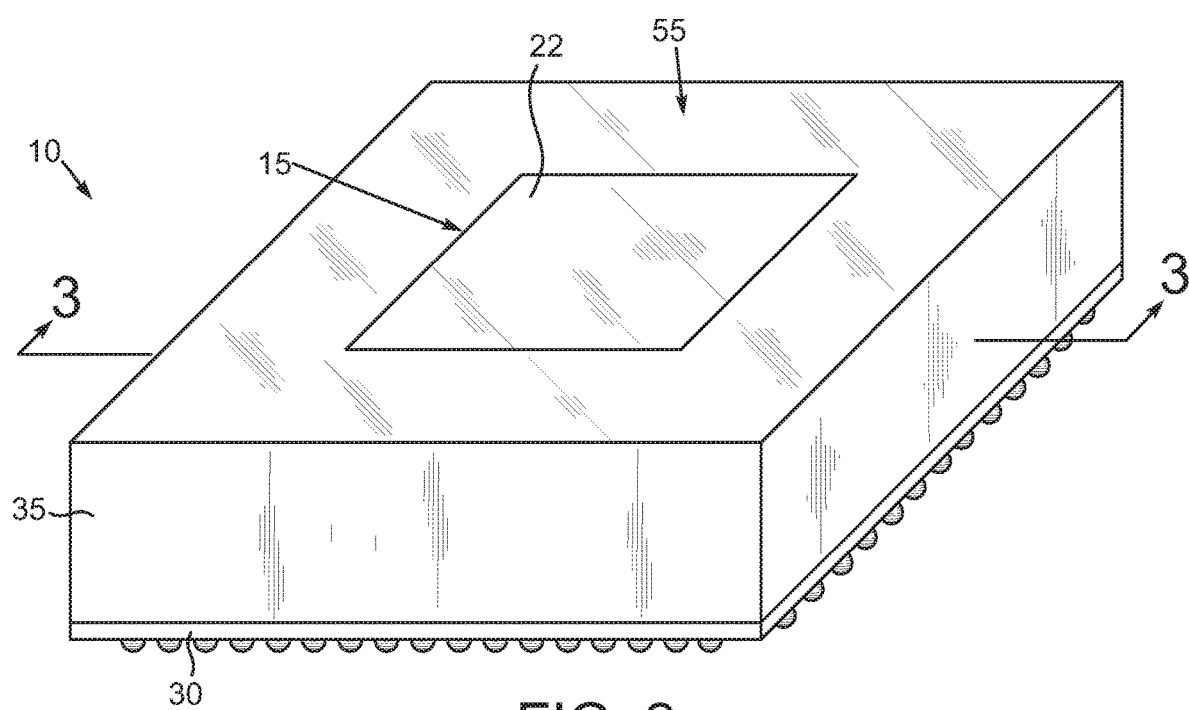
FIG. 2 is an unexploded version of the FIG. 1 pictorial.

FIG. 2 shows a pictorial view of the fully assembled semiconductor chip device 10 including the chip 30. As noted above, the molding material 35 at least partially encapsulates the chip stack 15. Here, the upper surface 55 of the molding material 35 may be coplanar with the upper surface of the topmost chip 22 of the chip stack 15. Additional details of the semiconductor chip device 10 can be understood by referring now also to FIG. 3, which is a sectional view of FIG. 2 taken at section 3-3. The lowermost semiconductor chip 28 of the chip stack 15 is electrically connected and mechanically mounted to the semiconductor chip 30 by way of the plural interconnects 45. The semiconductor chip 26 can be secured to the semiconductor chip 28 by an additional set of interconnects 60, which can be like the interconnects 45. Similar sets of interconnects 65 and 70 can be positioned between the semiconductor chips 24 and 26 and 22 and 24, respectively. If the chips 22, 24, 26 and 28 are stacked together prior to mounting on the semiconductor chip 30, then it is desirable for the interconnects 45 to have a lower reflow temperature than the interconnects 60, 65 and 70 to ensure that the reflow of the interconnects 45 during mounting of the stack 15 does not melt or otherwise damage the interconnects 60, 65 and 70. However, if the chip 28 is mounted first on the semiconductor chip 30 followed by the chips 26, 24 and 22 in sequence, then the interconnects 45 should have the higher of the reflow temperatures. As noted above, the I/O structures 50 can be used to interface the semiconductor chip 30 electrically with another device not shown. The semiconductor chips 22, 24, 26 and 28 include through-chip-vias (not shown) to provide through-chip pathways. In this way, data can be shared between the chips 22, 24, 26 and 28 and with the semiconductor chip 30 and power and ground routing can be provided to/from the chips 22, 24, 26 and 28 and the chip 30.

The semiconductor chip 30 includes a bulk semiconductor portion 75, an active circuitry portion 80 and a front side redistribution layer (RDL) structure 85, which is designed to provide routing between, among other things, the active circuitry portion 80 and the I/O structures 50. The bulk semiconductor portion 75 can be constructed of silicon, germanium, silicon-on-insulator or other types of substrate materials suitable for integrated circuit manufacture. The active circuitry portion 80 consists of the myriad of different types of circuit structures, such as transistors, capacitors, inductors, resistors, etc. that make up the logical and various elements for the semiconductor chip 30. The front side RDL structure 85 can consist of one or more stacked layers of interlevel dielectric and metallization layers that include traces, vias, etc. in order to provide electrical routing to the I/O structures 50. The chip 30 additionally includes a multitude of through-chip vias 90 that are designed to provide electrical conductivity between the semiconductor chip 30 and one or more of the semiconductor chips 22, 24, 26 and 28 in the chip stack 15. The through-chip vias 90 extend from the front side RDL structure 85 up through the active circuitry portion 80 and ultimately through the bulk semiconductor portion 75. A back side 92 of the semiconductor chip 30 includes a back side interconnect structure 95, which in this arrangement, is fabricated as a back end of line (BEOL) RDL structure. The back side interconnect structure 95 serves as a routing structure to interconnect the relatively large size interconnects 45 of the chip 28 and the relatively much smaller sized through-chip-vias 90 in the semiconductor chip 30. Note the location of the dashed box 105 in FIG. 3. The portion of FIG. 3 circumscribed by the dashed box 130 will be shown at greater magnification in FIG. 6 discussed below.

Figure 3:
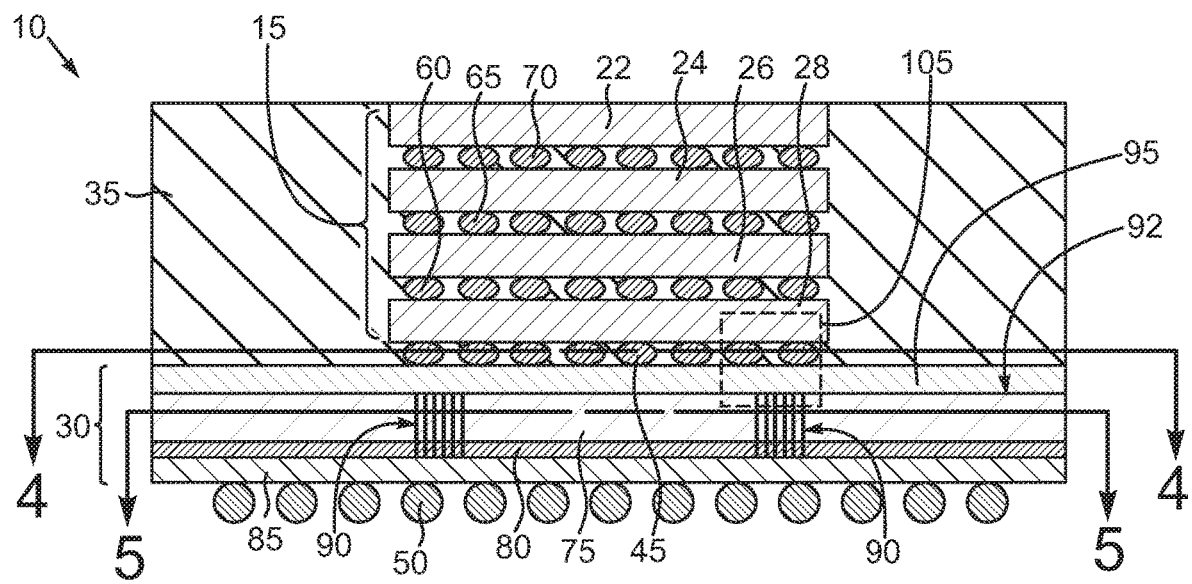
FIG. 3 is a sectional view of FIG. 2 taken at section 3-3.
Figure 4:
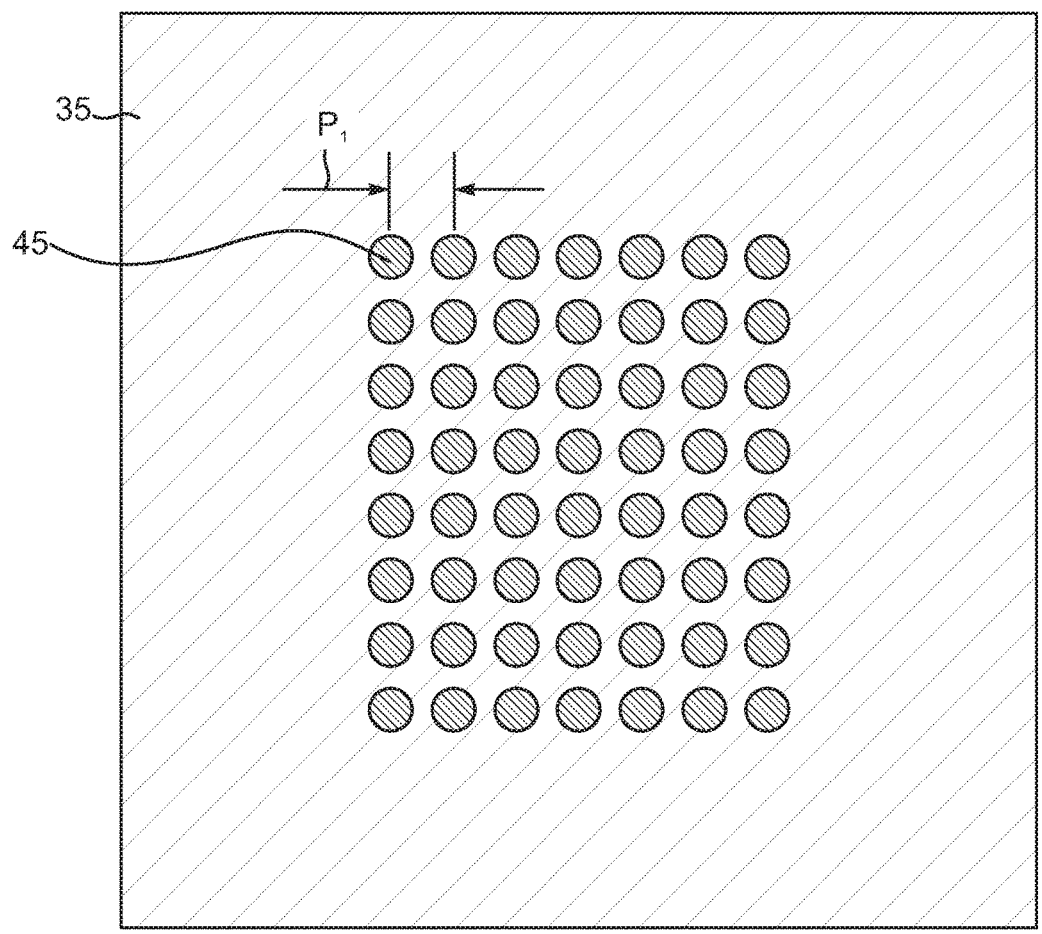
FIG. 4 is a sectional view of FIG. 3 taken at section 4-4.
Figure 5:
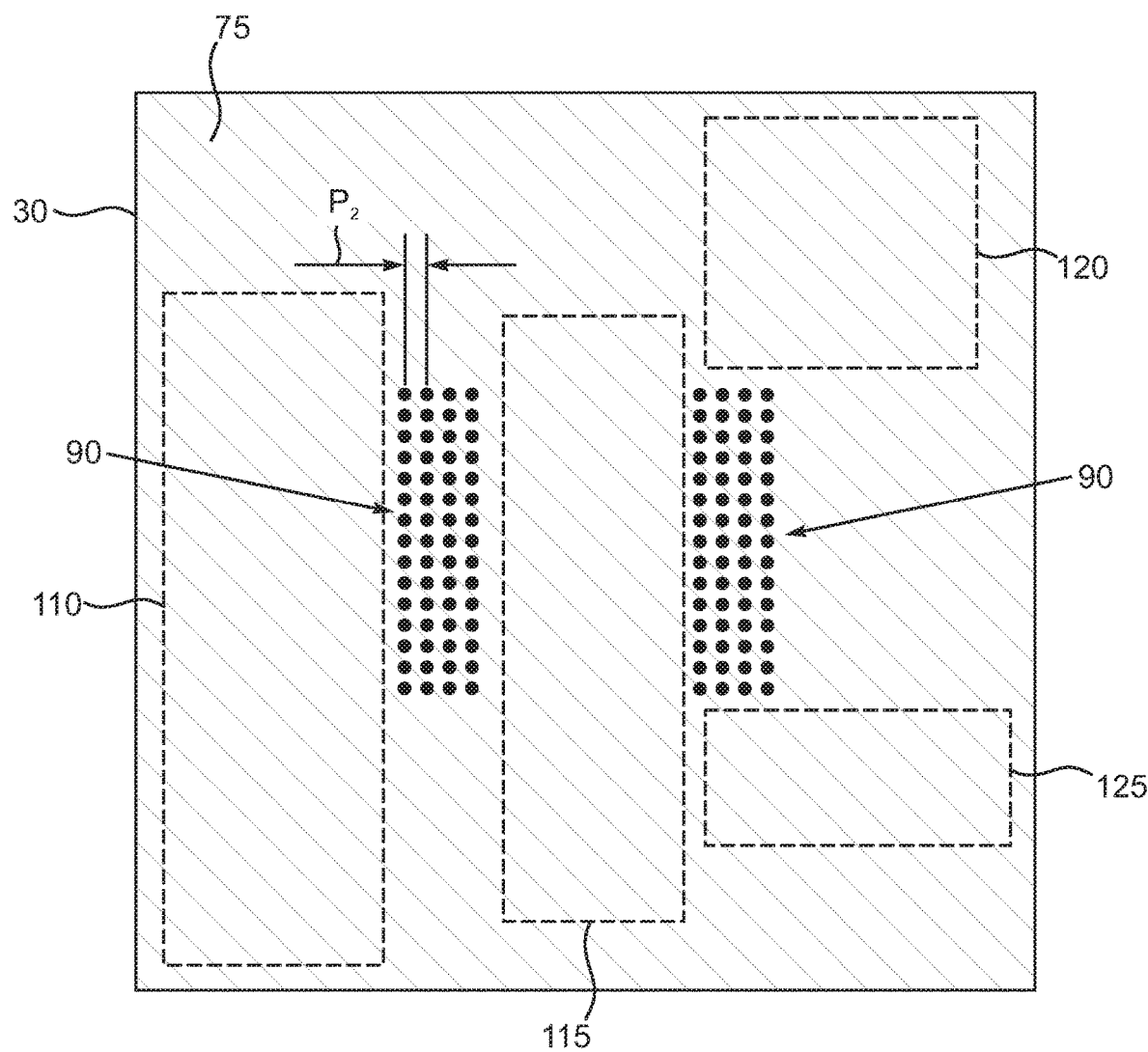
FIG. 5 is a sectional view of FIG. 3 taken at section 5-5.

The technical problem associated with interconnecting the interconnects 45 and the through-chip-vias 90 and the back side interconnect structure 95 solution may be understood by referring now also to FIGS. 4 and 5, which are sectional views of FIG. 3 taken at sections 4-4 and 5-5, respectively. Note that section 4-4 passes through the interconnects 45 as well as the molding material 35 while section 5-5 passes through the bulk semiconductor portion 75 and through-chip vias 90 of the semiconductor chip 30. As shown in FIG. 4, the interconnects 45 are manufactured with some minimum bump or interconnect pitch $P_1$ while the through-chip vias 90 are fabricated with a second minimum pitch $P_2$ that is much smaller than pitch $P_1$ and may be, depending upon device geometry, on the order of ten times smaller. Note also that the through-chip vias 90 are not typically arrayed with the same footprint as the interconnects 45, i.e., the interconnects 45 have one footprint and the through-chip vias 90 have a second footprint that can be both different and smaller than the first. This is due to the fact that the through-chip vias 90 must traverse the depth of the semiconductor chip 30 while avoiding various logic or so-called IP blocks 110, 115, 120 and 125. It should be understood that the number of IP blocks 110, 115, 120 and 125 may be substantially more than the four depicted as the dashed boxes. In any event, the provision of the back side interconnect structure 95 provides routing of electrical pathways between the interconnects 45 and the through-chip vias 90 that fan-in from the larger footprint of the interconnects 45 to the smaller footprint of the through-chip vias 90 while preserving the otherwise advantageous design rules used for the chip 30 and the chip 28, which of course may be dramatically different for a whole host of reasons.

Figure 6:
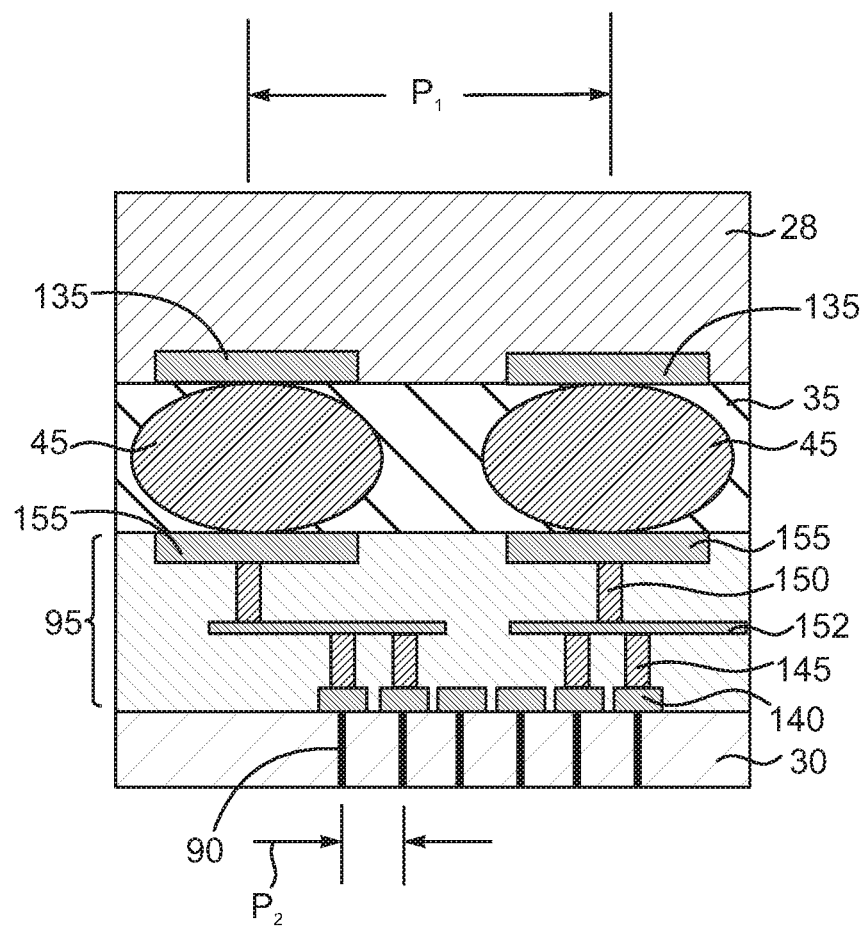
FIG. 6 is a portion of FIG. 3 shown at greater magnification.

Attention is now turned to FIG. 6, which as noted above, is the portion of FIG. 3 circumscribed by the dashed box 105 is shown at greater magnification. Due to the location of the dashed box 105, FIG. 6 depicts a portion of the semiconductor chip 28, two of the interconnects 45, the back side interconnect structure 95 and a portion of the semiconductor chip 30 as well as the portions of some of the through-chip vias 90. The semiconductor chip 28 includes bump or pillar pads 135 to ohmically connect to the interconnects 45. The back side interconnect structure 95 consists of one or more interconnect layers that consist of interlevel dielectric material and conductor structures. The conductor structures can take on an enormous variety of shapes, sizes, configurations, etc. Here, the conductor structures include conductor pads 140 to connect to the through-chip vias 90, plural vias 145 and 150, traces 152, and top layer conductor pads 155 that are designed to ohmically connect to the interconnects 45. In one arrangement, the back side interconnect structure 95 consists of three layers. However, two or more than three may be used depending upon the number of interconnects 45 and through-chip vias 90. The pads 140 and 155, vias 145 and 150 and traces 152 can be constructed of well-known conductor materials such as aluminum, copper, gold, platinum, palladium, etc. or using well-known plating, physical vapor deposition, chemical vapor deposition, or other techniques. The interlevel dielectric films used in the back side interconnect structure 95 can consist of well-known silicon dioxide and/or silicon nitride films. In this way, the interconnects 45 with some minimum pitch $P_1$ can be conveniently interconnected with the much smaller pitch $P_2$ through-chip vias 90 to facilitate power, ground and signal transmission between the chip 28 and the chip 30.

Figure 7:
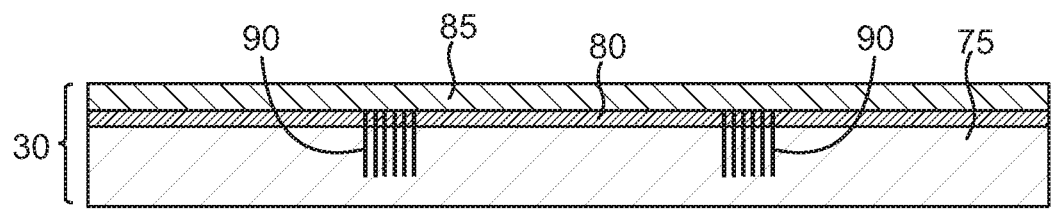
FIG. 7 is a sectional view depicting exemplary initial semiconductor chip fabrication.

The back side interconnect structure 95 can be constructed in a variety of ways. An exemplary method of fabricating the semiconductor chip device 10 including the back side interconnect structure 95 may be understood by referring now to FIGS. 7, 8, 9, 10, 11 and 12 and initially to FIG. 7, which is a sectional view of the semiconductor chip 30 at a certain point in processing. The semiconductor chip device 30 is advantageously fabricated as a wafer level process and thus is initially a part of a semiconductor wafer (not shown). The semiconductor chip 30 has undergone a myriad of different types of semiconductor processes to fabricate the various logic devices and other interconnect structures, etc. for the active circuit area 80, the front side RDL 85 and the through-chip vias 90. At this point, the bulk semiconductor portion 75 has not yet been thinned to expose the through-chip vias 90.

Figure 8:
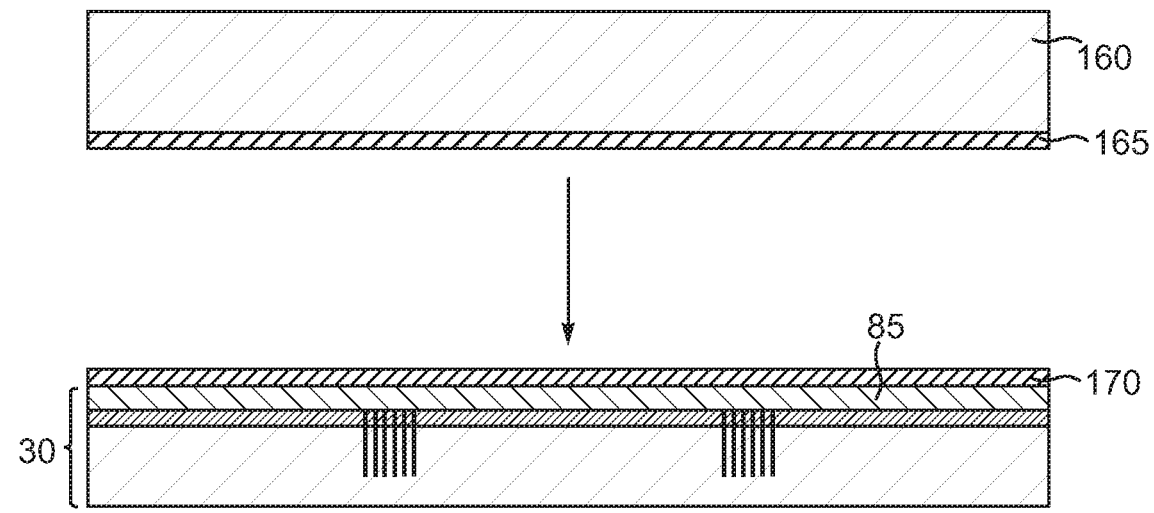
FIGS. 8 and 9 are sectional views like FIG. 7, but depicting exemplary carrier wafer attachment.
Figure 9:
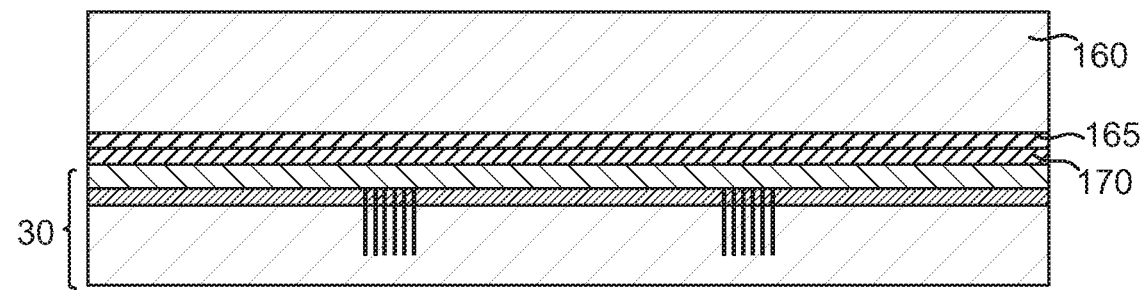
Figure 10:
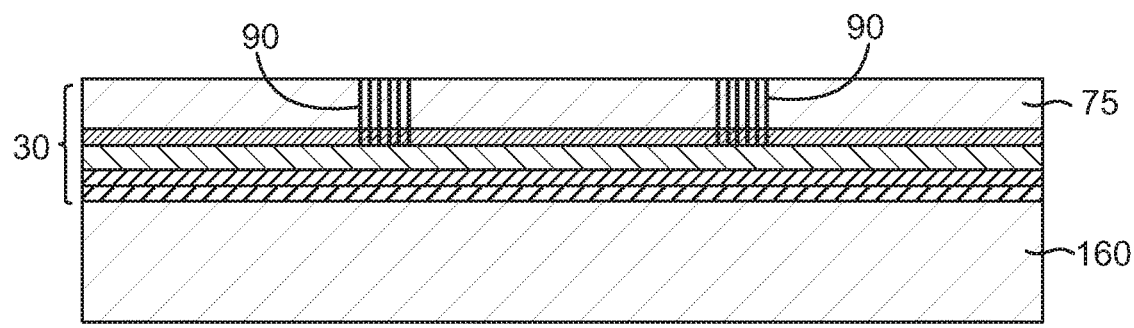
FIG. 10 is a sectional view like FIG. 9, but depicting exemplary through-chip via reveal.

As shown in FIG. 8, and to facilitate further processing, the semiconductor chip 30 is mounted to a carrier wafer 160. This exemplary process uses oxide bonding in lieu of polymer adhesives to join the carrier wafer 160, so the mounting process is preceded by the plasma enhanced chemical vapor deposition of an oxide film 165 on the carrier wafer 160 and a corresponding oxide film 170 the semiconductor chip 30 and in particular on the front side RDL 85. The carrier wafer 160 is advantageously composed of a blank silicon wafer and when brought together with the semiconductor chip 30, the respective oxide films 165 and 170 form a fusion wafer-to-wafer bond joining the semiconductor chip 30 to the carrier wafer 160 as shown in FIG. 9. Next and as shown in FIG. 10, the bulk semiconductor portion 75 is thinned to expose the through-chip vias 90. This thinning process can be performed in a variety of ways. In one so-called "hard reveal" technique, a grinding process is used to expose the through-chip vias 90 followed by an etch back of a small amount of the silicon or other semiconductor of the bulk semiconductor portion 75, followed by a thin oxide growth or deposition or a thin silicon nitride deposition by CVD and again followed by a chemical mechanical planarization in order to finalize the through-chip via reveal. In another technique involving a so-called "soft reveal," the bulk semiconductor portion 75 is subjected to a grinding process to just above the tops of the through-chip vias, followed by an etch back and an oxide and/or nitride deposition and ultimately a chemical mechanical polishing (CMP) step to perform the through-chip via reveal. This second technique avoids exposing the silicon 75 to loose copper or other metal particles that can be liberated during a hard reveal. Again, the carrier wafer 160 facilitates these various grinding, etching and CMP processes.

Figure 11:
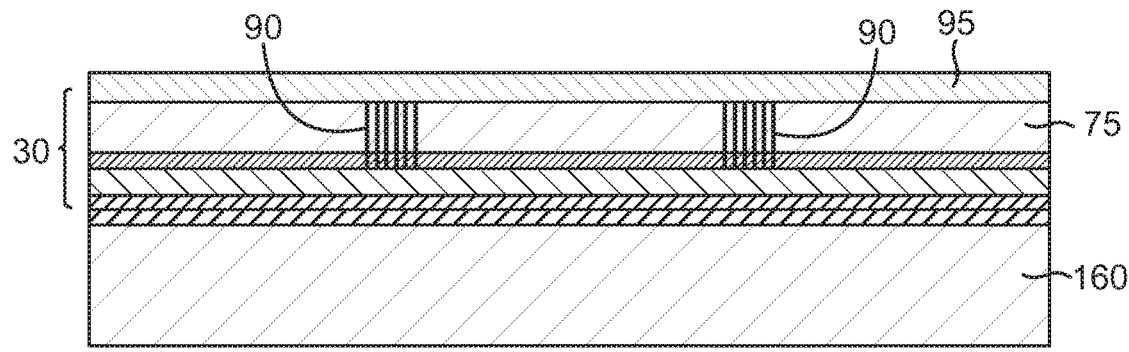
FIG. 11 is a sectional view like FIG. 10, but depicting exemplary back end of line structure fabrication.
Figure 12:
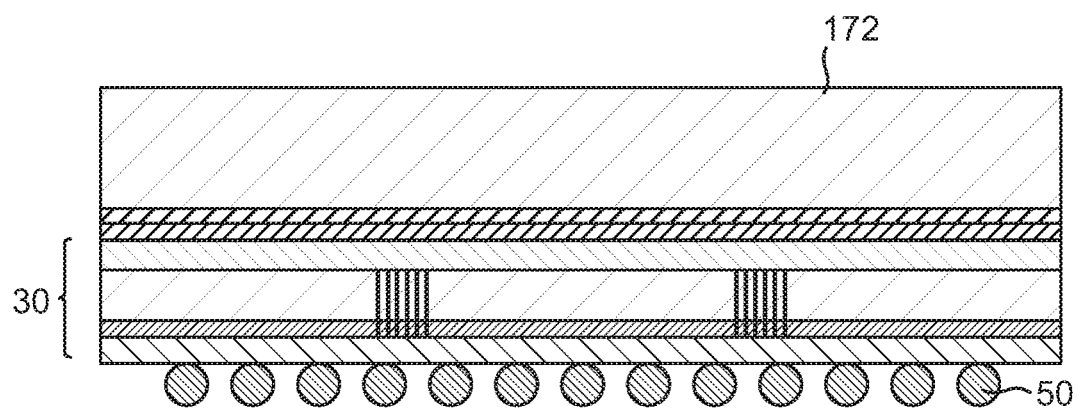
FIG. 12 is a sectional view like FIG. 11, but depicting exemplary wafer carrier removal and new carrier wafer application.

Following the through-chip via reveal depicted in FIG. 10, the back side interconnect structure 95 is fabricated on the bulk semiconductor portion 75 as shown in FIG. 11. This entails creation of the various RDL structures, a few of which are depicted in FIG. 6. As noted above, this fabrication process can include well-known masking, plating, other material deposition, etching, etc. in order to create the various conductor structures in the back side interconnect structure 95. At this stage, a new carrier wafer 172 is mounted on the back side interconnect structure 95 using the same oxide-to-oxide bonding just described or another bonding technique, the existing carrier wafer 160 is removed using well-known techniques and the I/O structures 50 are placed on the chip 30 as shown in FIG. 12.

Figure 13:
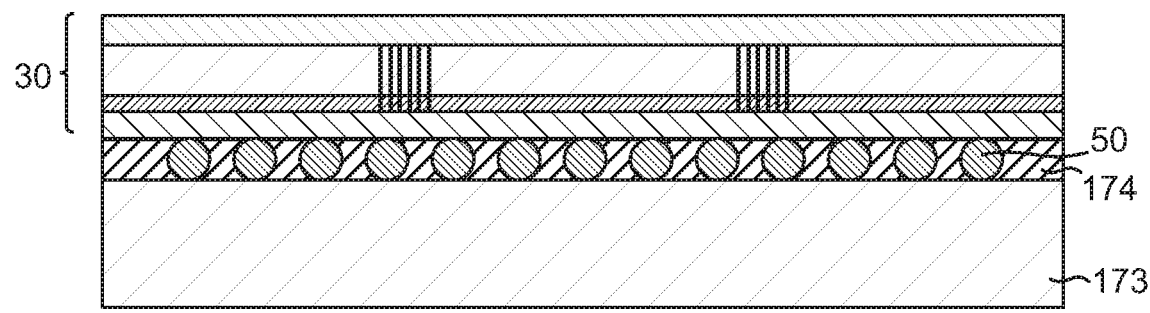
FIG. 13 is a sectional view like FIG. 12, but depicting exemplary wafer carrier removal and new carrier wafer application.
Figure 14:
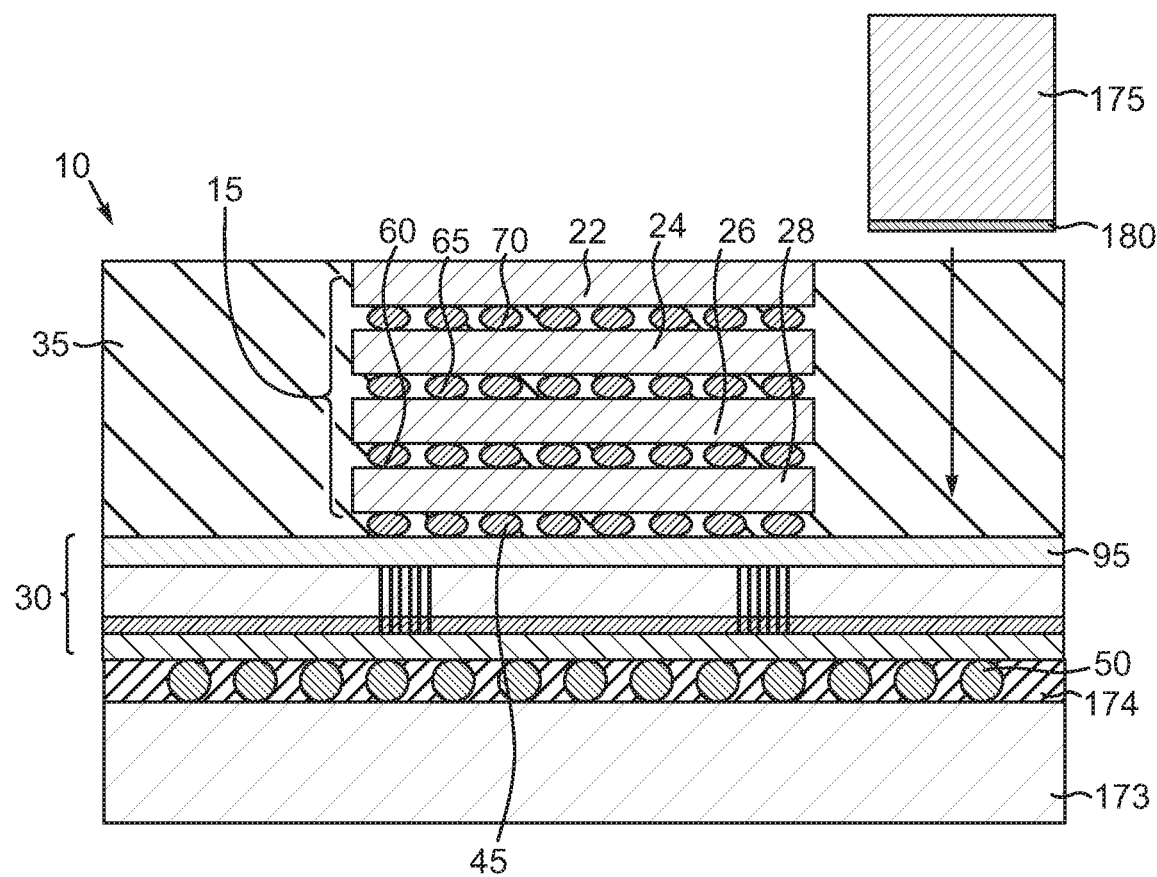
FIG. 14 is a sectional view like FIG. 13, but depicting exemplary chip stacking and molding.

Next and as shown in FIG. 13, another carrier wafer 173 is mounted to the chip 30 over the I/O structures 50 using an adhesive 174 and the carrier wafer 172 is removed using well-known techniques, such as grinding. The carrier wafer 173 can be constructed of well-known glass materials or others. With the new carrier wafer 173 in place the chip 30 is ready for placement of the chip stack 15 thereon and molding. As shown in FIG. 14, the chip stack 15 is mounted on the back side interconnect structure 95 and the molding material 35 is molded onto the semiconductor chip 30. The interconnects 45 are established between the semiconductor chip 28 and the back side interconnect structure 95 using well-known techniques for material plating, deposition or otherwise. This entails plating or printing solder bumps, plating or depositing conductive pillars with solder caps, pick and place or other techniques, and requisite reflows, depending upon the structures selected for the interconnects 45. The molding material 35 is advantageously formed by way of well-known compression molding techniques and is done so to at least initially encapsulate the semiconductor chips 22, 24, 26 and 28 and the upper side of the chip 30. A subsequent grinding process is used to expose the upper surface of the topmost chip 22. As noted above, the chips 22, 24, 26 and 28 of the stack 15 can be mounted on en masse or sequentially or some combination of the two. If desired, optional dummy components 175 can be mounted on the back side interconnect structure 95 prior to the molding process. These optional dummy components 175 can facilitate the transfer of heat from the semiconductor chip up through the molding material. In this way, a heat spreader of one sort or another can be eventually positioned on the dummy components 175 and also placed in thermal contact with the topmost semiconductor chip 22 to convey heat away. The dummy components 175 can be composed of silicon, copper, graphite, sapphire, diamond or other thermally conducting materials. Silicon is relatively inexpensive. The dummy components 175 can include a thermal interface material/adhesive film 180 that can be composed of silicone, metals or other materials. The grinding process can also expose and planarize any dummy components 175. The carrier wafer 173 is removed using well-known techniques. At this point, the semiconductor chip device 10 that includes the chip stack 15 and the semiconductor chip 30 and the molding material 35 is ready to be singulated from the other portions of the semiconductor wafer (not shown). The singulation process can be conducted using mechanical sawing, laser cutting or combinations of these or other cutting techniques and yields the completed semiconductor chip device 10 depicted in FIG. 12.

Figure 15:
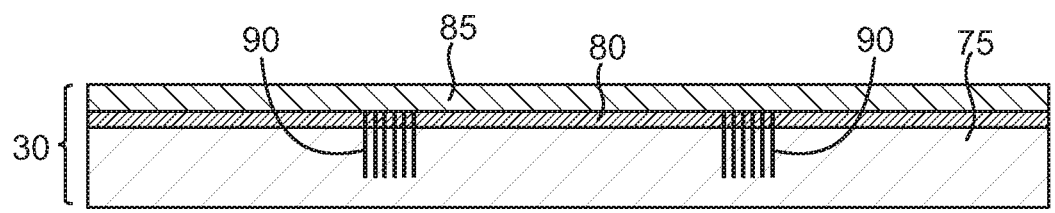
FIG. 15 is a sectional view depicting exemplary initial semiconductor chip fabrication.
Figure 16:
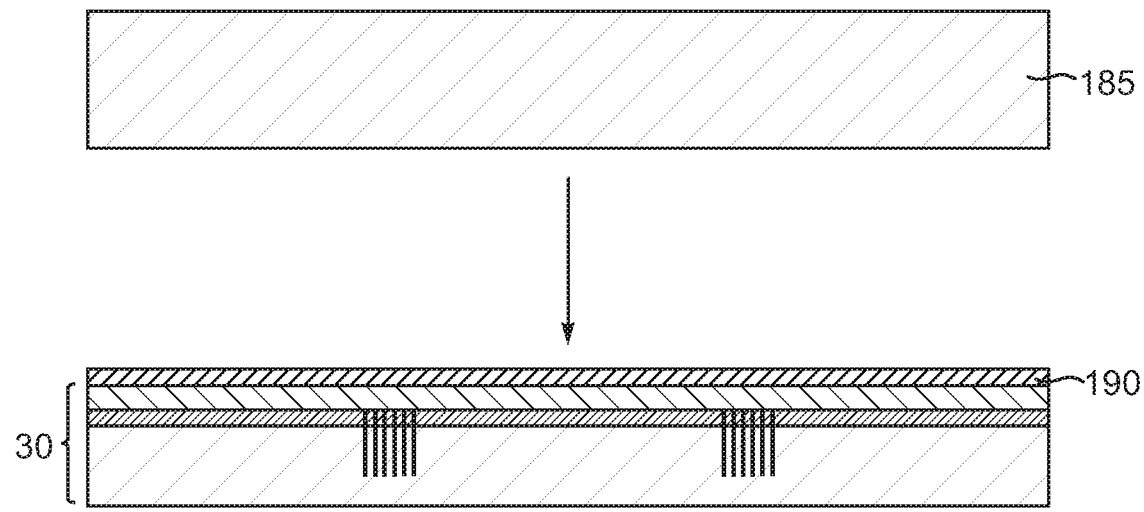
FIGS. 16 and 17 are sectional views like FIG. 15, but depicting alternate exemplary carrier wafer attachment.
Figure 17:
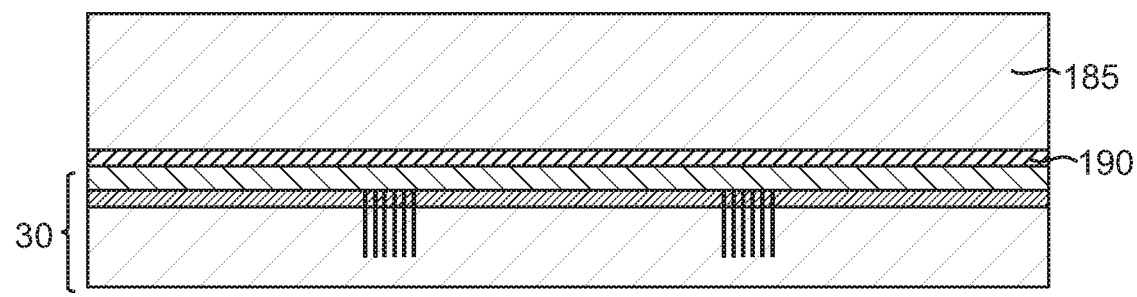

In the foregoing exemplary fabrication method, an oxide-to-oxide wafer-to-wafer bond is used and thus obviates the need for an adhesive to connect a carrier wafer to a working wafer. It should be understood that a variety of temporary bonding techniques capable of withstanding 400° C. process temperatures can be used. Accordingly, an adhesive may be used and an alternate exemplary method employing this technique will be illustrated now and described in conjunction with FIGS. 15, 16, 17, 18, 19, 20, 21 and 22. Attention is turned initially to FIG. 15. The semiconductor chip 30 depicted in FIG. 13 is processed as generally described above in conjunction with FIG. 7 such that the bulk semiconductor portion 75 has yet to be thinned to expose the through-chip vias 90 but the active circuit region 80 and the front side RDL 85 have been manufactured as generally described elsewhere herein. Next and as shown in FIGS. 16 and 17, a carrier substrate or wafer 185 is attached to the semiconductor chip 30 by way of an adhesive film 190. The adhesive can be a light activated polymeric adhesive, such as a light activated epoxy or other type of adhesive as desired. After application of the adhesive 190 to the front side RDL 85, the carrier wafer 185 can be seated on the semiconductor chip 30. Since an adhesive 190 is used, the carrier wafer 185 can be constructed of silicon dioxide glass or other types of glasses or even a semiconductor as desired. At this point, the semiconductor chip 30 is ready for additional processing.

Figure 18:
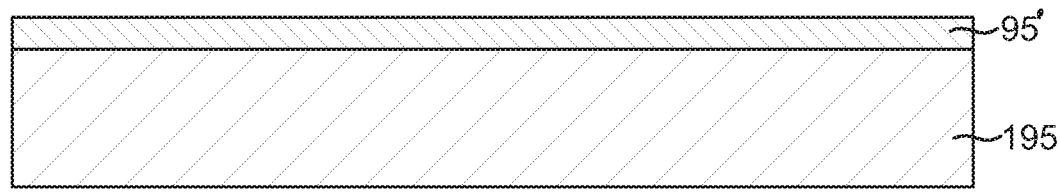
FIG. 18 is a sectional view depicting alternate exemplary back end of line structure fabrication.
Figure 19:
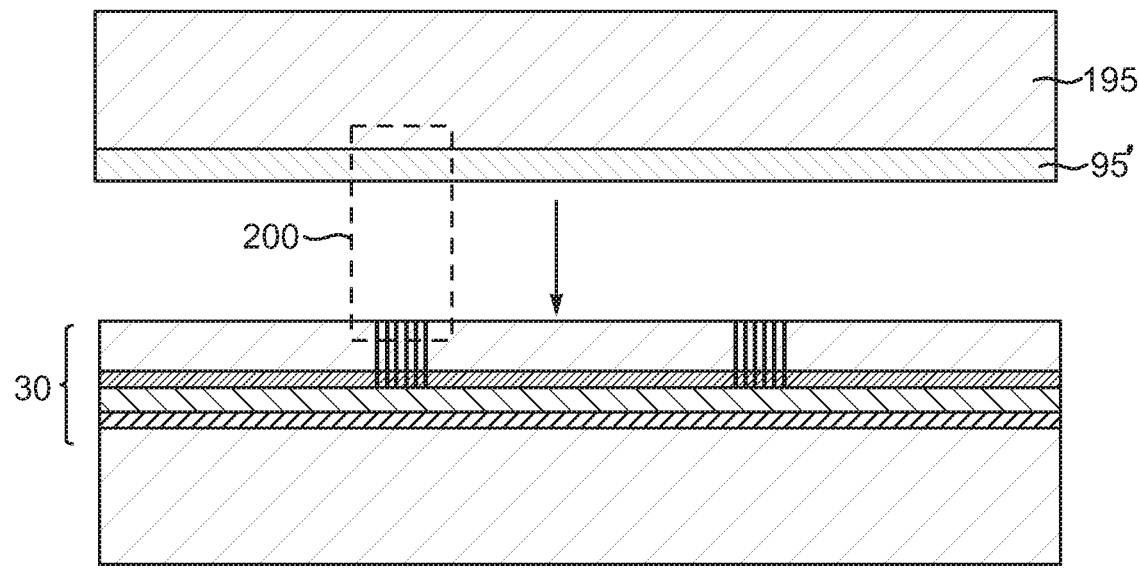
FIG. 19 is a sectional view like FIG. 17, but depicting exemplary back end of line structure mounting.
Figure 20:
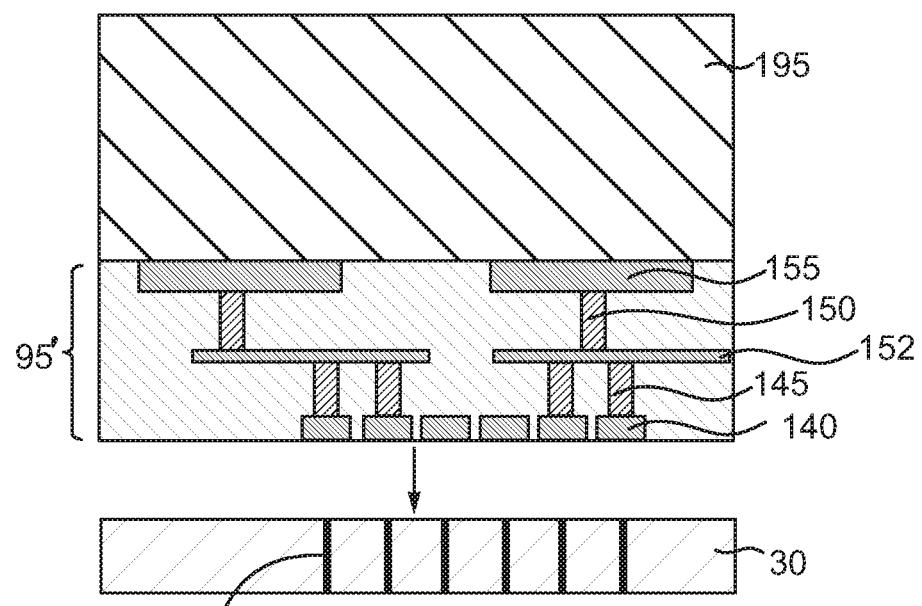
FIG. 20 is a portion of FIG. 19 shown at greater magnification.
Figure 21:
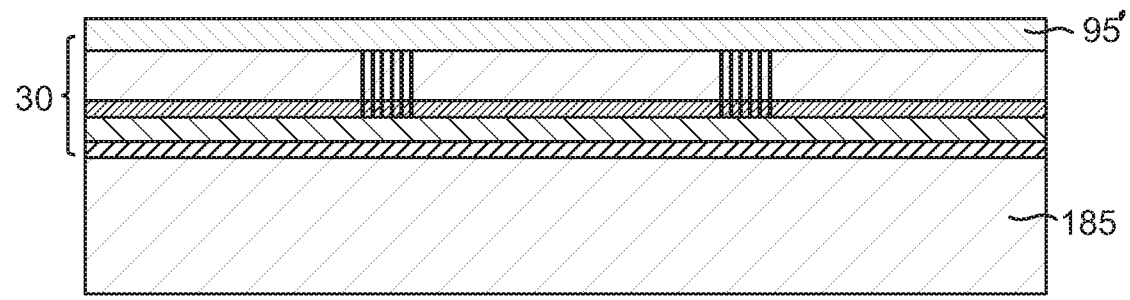
FIG. 21 is a sectional view like FIG. 17 depicting exemplary back end of line structure mounting.
Figure 22:
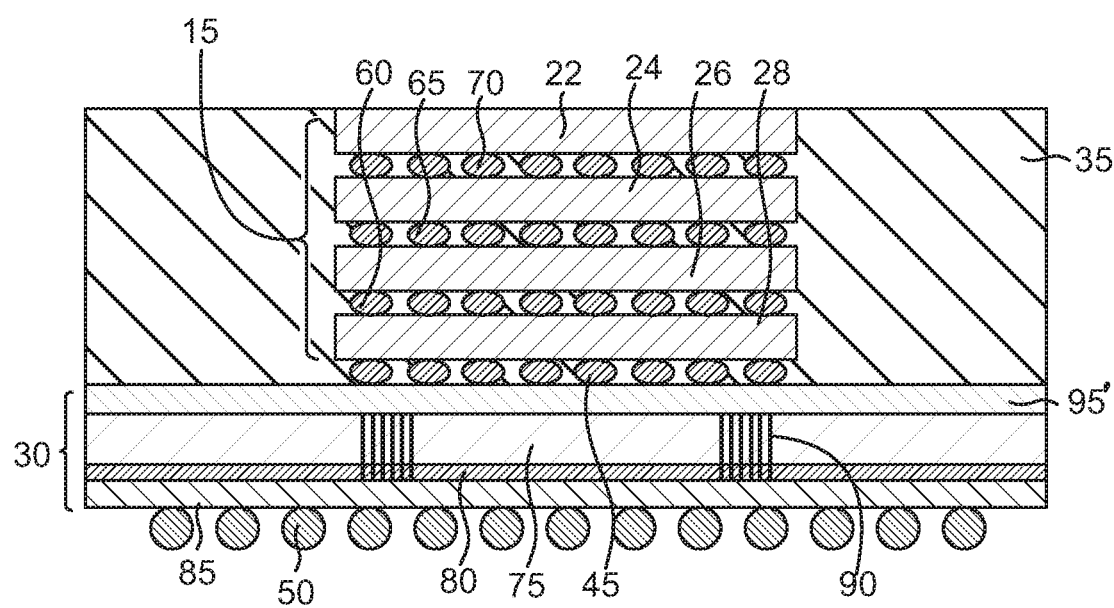
FIG. 22 is a sectional view like FIG. 21, but depicting exemplary chip stacking and molding.
Figure 23:
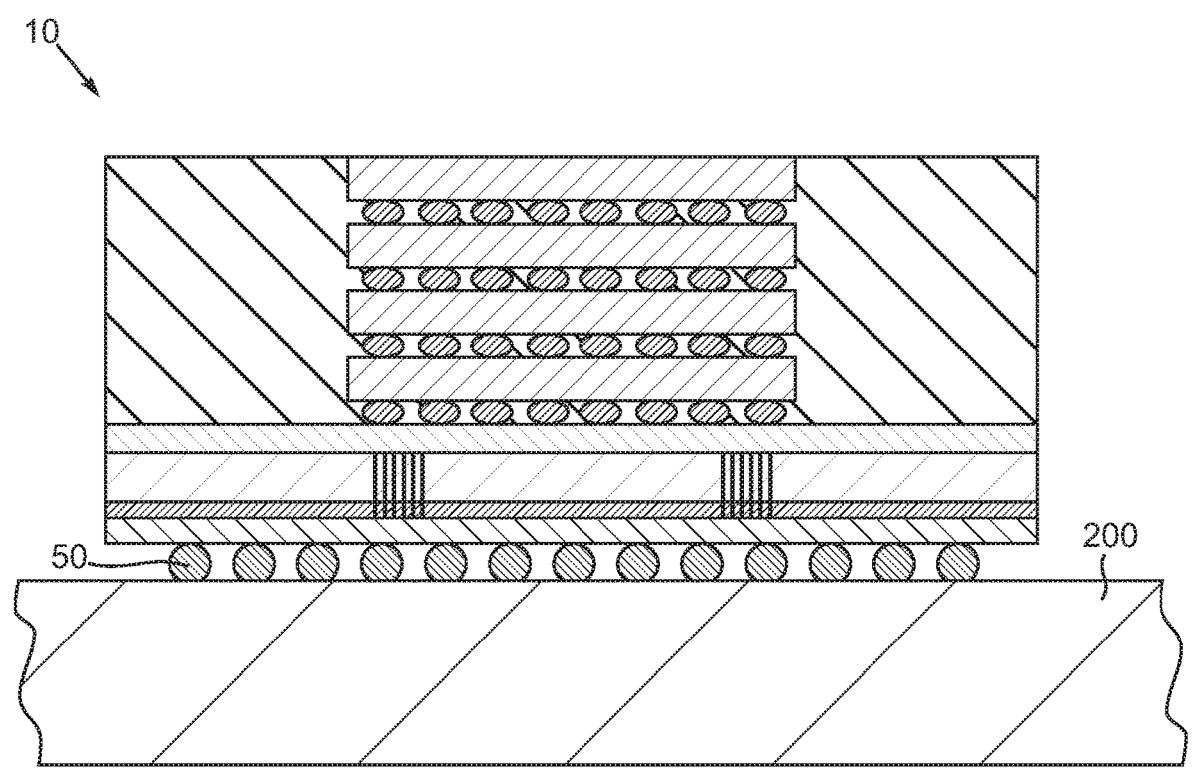
FIG. 23 is a sectional view depicting exemplary semiconductor chip device mounting on a circuit board.

In a process flow that can be performed in parallel, or not, with the processing of the chip 30 just described, a back side interconnect structure 95' is fabricated on a semiconductor interposer 195 as shown in FIG. 18. In subsequent steps, the back side interconnect structure 95' will be mounted on the semiconductor chip 30 as a separate integral piece in lieu of the sequential fabrication steps used to fabricate the back side interconnect structure 95 disclosed elsewhere herein. The semiconductor interposer 195 can be composed of silicon, germanium, silicon-on-insulator or other types of semiconductor materials. The back side interconnect structure 95' can be identical in basic structure to the back side interconnect structure 95 described elsewhere herein. Next and as shown in FIG. 19, the back side interconnect structure 95' and the semiconductor interposer 195 may be flipped over from the orientation shown in FIG. 18 and mounted on the backside of the semiconductor chip 30. Note that prior to this mounting step, the bulk semiconductor portion 75 of the semiconductor chip 30 undergoes a thinning process of the types described elsewhere herein to reveal the through-chip vias 90. Note the dashed rectangle 200 in FIG. 19. The portion of FIG. 19 circumscribed by the dashed rectangle 200 is shown at greater magnification in FIG. 20. As shown in FIG. 20, as the carrier substrate 195 and the back side interconnect structure 95' are brought into engagement with the semiconductor chip 30, the various conductor structures of the back side interconnect structure 95' are brought into engagement with the revealed through-chip vias 90 of the semiconductor chip 30. As with the back side interconnect structure 95 described elsewhere herein, the back side interconnect structure 95' includes multiple interlevel dielectric layers, multiple conductor layers, etc. to include the conductor pads 140 and 155, the conductive vias 145 and 150 and traces 152. The pads 140 are brought into metallurgical contact with the through-chip vias 90 and copper/oxide hybrid bonding or other techniques may be used to establish metallurgical bonds between the pads 140 and the through-chip vias 90. Next and as shown in FIG. 21, the carrier substrate 195 is detached from the back side interconnect structure 95' leaving the back side interconnect structure 95' coupled to the semiconductor chip 30. This process is undertaken while the other carrier substrate 185 is still connected to the chip 30. The interconnects 45 can be mounted on the back side interconnect structure 95' before or concurrently with the mounting of the semiconductor chip 28 of the stack 15. Of course, if the interconnects 45 are multi-component structures, such as copper pillars with solder caps, then the backside proximate pillars would be placed first and thereafter topped by the mating pillars and solder caps of the chip 28. The remainder of the stack 15 including the chips 22, 24, 26 and 28 and the interconnects 60, 65 and 70 can be manufactured or otherwise positioned as described above in conjunction with the other exemplary fabrication technique and the molding material 35 can be positioned as described above as well. Furthermore, the I/O structures 50 are fabricated on the front side RDL layer 85. The back side interconnect structure 95' now mounted on the bulk semiconductor portion 75 serves as a routing structure to interconnect the relatively large size interconnects 45 of the chip 28 and the relatively much smaller sized through-chip vias 90 in the semiconductor chip 30. Following mounting of the stack 15 and molding of the molding material 35, the carrier wafer 185 can be detached using well-known techniques.

As noted elsewhere herein, the interconnects 45, 60, 65 and 70 of any of the disclosed arrangements can take on a variety of alternative forms. For example, conductive pillars on each of two adjacent stacked chips can be copper/oxide hybrid bonded. In yet another alternative arrangement, a hybrid bonding technique is used. Again, facing oxide films are formed on each of two adjacent chips. But conductive islands of copper or otherwise are interspersed in the oxide films. The chips are stacked with the respective conductive islands aligned vertically and a heating process in excess of about 200° C. is performed to bond the conductive islands together.

It should be understood that any of the disclosed embodiments of a semiconductor chip device 10 can be mounted on a circuit board, such as the circuit board 200 depicted in FIG. 21. The I/O structures 50 establish the requisite metallurgical connections with the circuit board 200 and in particular to conductor pads (not shown) of the circuit board 200. Where for example the I/O structures 50 are implemented as conductive pillars, then well-known solder-on-pad techniques can be used to join the I/O structures 50 to the circuit board 200. The circuit board 200 can be a package substrate, a system board or virtually any type of board.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip device, comprising:
a first semiconductor chip having a front side and a back side, plural through chip vias and I/O structures, the through chip vias having a first footprint, the back side being configured to have a second semiconductor chip stacked thereon, the second semiconductor chip including plural interconnects having a second footprint larger than the first footprint;
the back side including a back side redistribution layer structure (RDL) configured to connect to the interconnects and provide fanned-in pathways to the through chip vias, the back side RDL structure including one or more interconnect layers that consist of interlevel dielectric material and conductor structures; and
the front side including a front side RDL structure connected to the through chip vias and providing fanned-out pathways to the I/O structures, the first semiconductor chip not being embedded in the front side RDL structure.

2. The semiconductor chip device of claim 1, comprising the second semiconductor chip mounted on the back side.

3. The semiconductor chip device of claim 2, comprising a molding material at least partially encapsulating the second semiconductor chip.

4. The semiconductor chip device of claim 1, wherein the back side RDL structure comprises plural conductor layers.

5. The semiconductor chip device of claim 1, comprising a dummy component mounted on the back side to transfer heat from the first semiconductor chip.

6. The semiconductor chip device of claim 1, wherein the interconnects comprise microbumps.

7. The semiconductor chip device of claim 1, comprising a circuit board, the first semiconductor chip being mounted on the circuit board.

8. A semiconductor chip device, comprising:
a first semiconductor chip having a front side and a back side, and plural through chip vias and I/O structures, the through chip vias having a first footprint
plural second semiconductor chips stacked on the back side of the first semiconductor chip, a lowermost of the second semiconductor chips including plural interconnects having a second footprint larger than the first footprint;
the back side including a back side redistribution layer (RDL) structure configured to connect to the interconnects and provide fanned-in pathways to the through chip vias, the back side RDL structure including one or more interconnect layers that consist of interlevel dielectric material and conductor structures; and
the front side including a front side RDL structure connected to the through chip vias and providing fanned-out pathways to the I/O structures, the first semiconductor not being embedded in the front side RDL structure.

9. The semiconductor chip device of claim 8, comprising a molding material at least partially encapsulating the second semiconductor chips.

10. The semiconductor chip device of claim 8, wherein the back side RDL structure comprises plural conductor layers.

11. The semiconductor chip device of claim 8, comprising a dummy component mounted on the back side to transfer heat from the first semiconductor chip.

12. The semiconductor chip device of claim 8, wherein the interconnects comprise microbumps.

13. The semiconductor chip device of claim 8, comprising a circuit board, the first semiconductor chip being mounted on the circuit board.

14. A method of manufacturing a semiconductor chip device, comprising:
fabricating a back side redistribution layer structure (RDL) on a back side of a first semiconductor chip, the first semiconductor chip having plural through-chip vias with a first footprint, the back side being configured to have a second semiconductor chip stacked thereon, the second semiconductor chip including plural interconnects having a second footprint larger than the first footprint;
the back side RDL structure is configured to connect to connect to the interconnects and provide fanned-in pathways to the through chip vias, the back side interconnect structure including one or more interconnect layers that consist of interlevel dielectric material and conductor structures;
fabricating plural I/O structures on a front side of the first semiconductor chip; and
fabricating a front side RDL structure on the front side that electrically connects to the through chip vias and provides fanned-out pathways to the I/O structures and that does not embed the first semiconductor chip.

15. The method of claim 14, comprising stacking the second semiconductor chip on the back side.

16. The method of claim 15, comprising at least partially encapsulating the second semiconductor chip with a molding material.

17. The method of claim 14, wherein the back side RDL structure comprises plural conductor layers.

18. The method of claim 14, comprising mounting a dummy component mounted on the back side to transfer heat from the first semiconductor chip.

19. The method of claim 14, wherein the interconnects comprise microbumps.

20. The method of claim 14, comprising mounting the first semiconductor chip on a circuit board.

* * * * *